United States Patent
Kim

(10) Patent No.: US 11,976,349 B2
(45) Date of Patent: May 7, 2024

(54) DEPOSITION MASK FOR OLED PIXEL DEPOSITION

(71) Applicant: LG INNOTEK CO., LTD., Seoul (KR)

(72) Inventor: Nam Ho Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 97 days.

(21) Appl. No.: 17/554,071

(22) Filed: Dec. 17, 2021

(65) Prior Publication Data

US 2022/0195579 A1    Jun. 23, 2022

(30) Foreign Application Priority Data

Dec. 22, 2020 (KR) .................. 10-2020-0180951

(51) Int. Cl.
*C23C 14/04* (2006.01)
*H10K 71/16* (2023.01)

(52) U.S. Cl.
CPC ......... *C23C 14/042* (2013.01); *H10K 71/166* (2023.02)

(58) Field of Classification Search
CPC .. H10K 71/166; C23C 14/042; C23C 16/042; C23C 8/04; C23C 10/04; C23C 14/04;
(Continued)

(56) References Cited

U.S. PATENT DOCUMENTS

2021/0175513 A1* 6/2021 Horie .............. B32B 15/01
2021/0313515 A1 10/2021 Jung et al.

FOREIGN PATENT DOCUMENTS

| EP | 3419074 | 12/2018 |
|---|---|---|
| KR | 10-2017-0112810 | 10/2017 |
| KR | 10-2020-0058072 | 5/2020 |

\* cited by examiner

*Primary Examiner* — Aiden Lee
(74) *Attorney, Agent, or Firm* — KED & ASSOCIATES, LLP

(57) ABSTRACT

A deposition mask according to an embodiment includes a metal plate including a first surface and a second surface opposite to the first surface wherein the metal plate includes iron (Fe) and nickel (Ni), a thickness of the metal plate is 15 μm to 30 μm, and the metal plate includes a first surface layer having a depth of 20% or less of the thickness of the metal plate from the first surface and a second surface layer having a depth of 20% or less of the thickness of the metal plate from the second surface, wherein when diffraction intensity with respect to a (111) crystal plane of the first surface layer is defined as I (111), diffraction intensity with respect to a (200) crystal plane is defined as I (200), and diffraction intensity with respect to a (220) crystal plane is defined as I (220), a ratio of diffraction intensity of I (220) is defined by Equation 1 below, $$A = I(220)/(I(200)+I(220)+I(111))$$ [Equation]

a ratio of diffraction intensity of I (200) is defined by Equation 2 below, $$B = I(200)/(I(200)+I(220)+I(111))$$ [Equation 2]

a ratio of diffraction intensity of I (111) is defined by Equation 3 below, $$C = I(111)/(I(200)+I(220)+I(111))$$ [Equation 3]

a value of the A is greater than a value of the B and a value of the C, the value of the B is greater than the value of the C, and when a ratio of the B to the A (B/A) is defined as D, a value of the D is 0.5 to less than 1.

9 Claims, 5 Drawing Sheets

(58) Field of Classification Search
CPC ....... C23C 14/044; C23C 16/04; C23C 18/06; C30B 25/04
See application file for complete search history.

【FIG. 1】
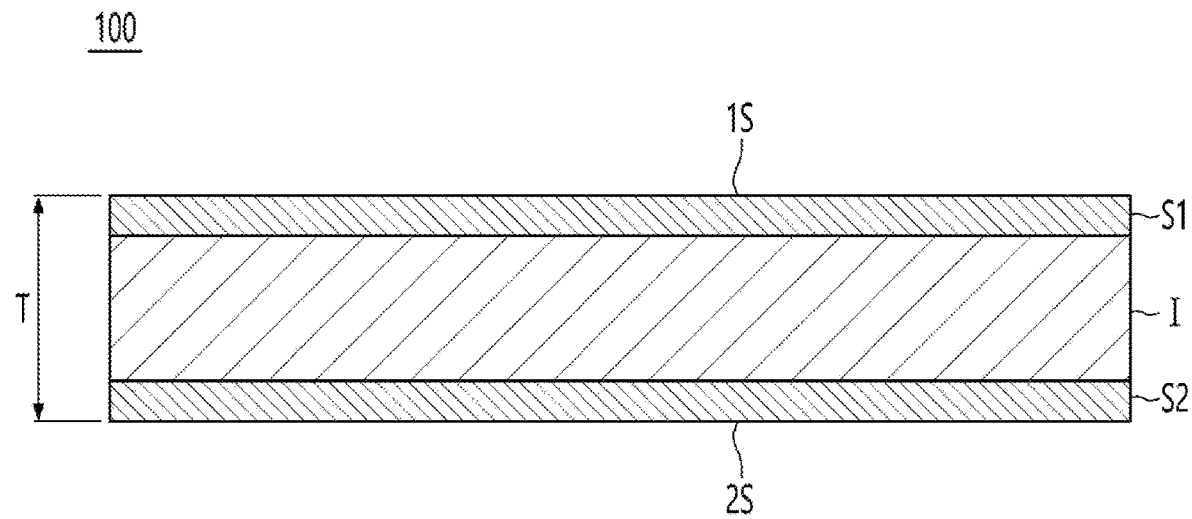
【FIG. 2】
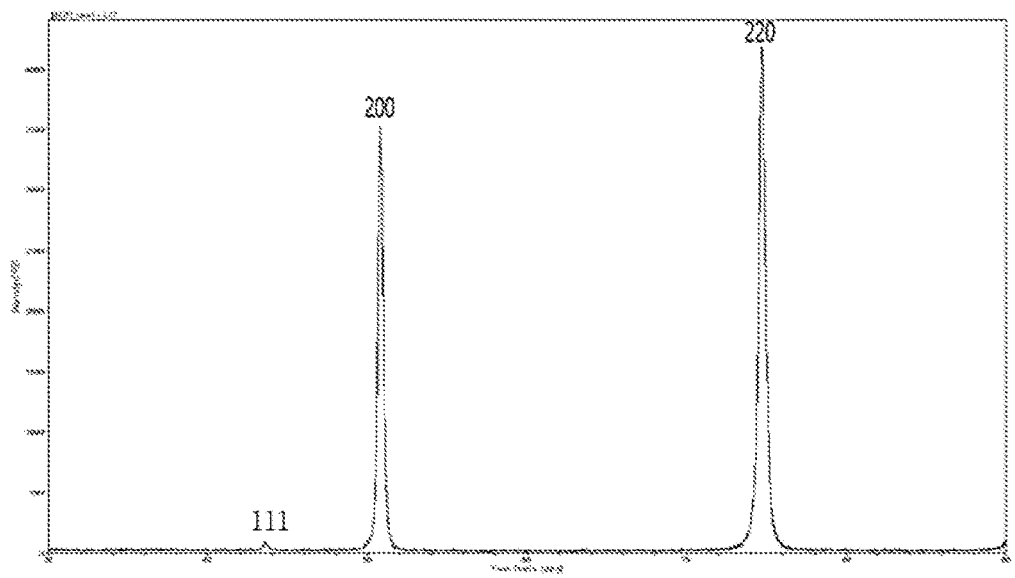

[FIG. 3]
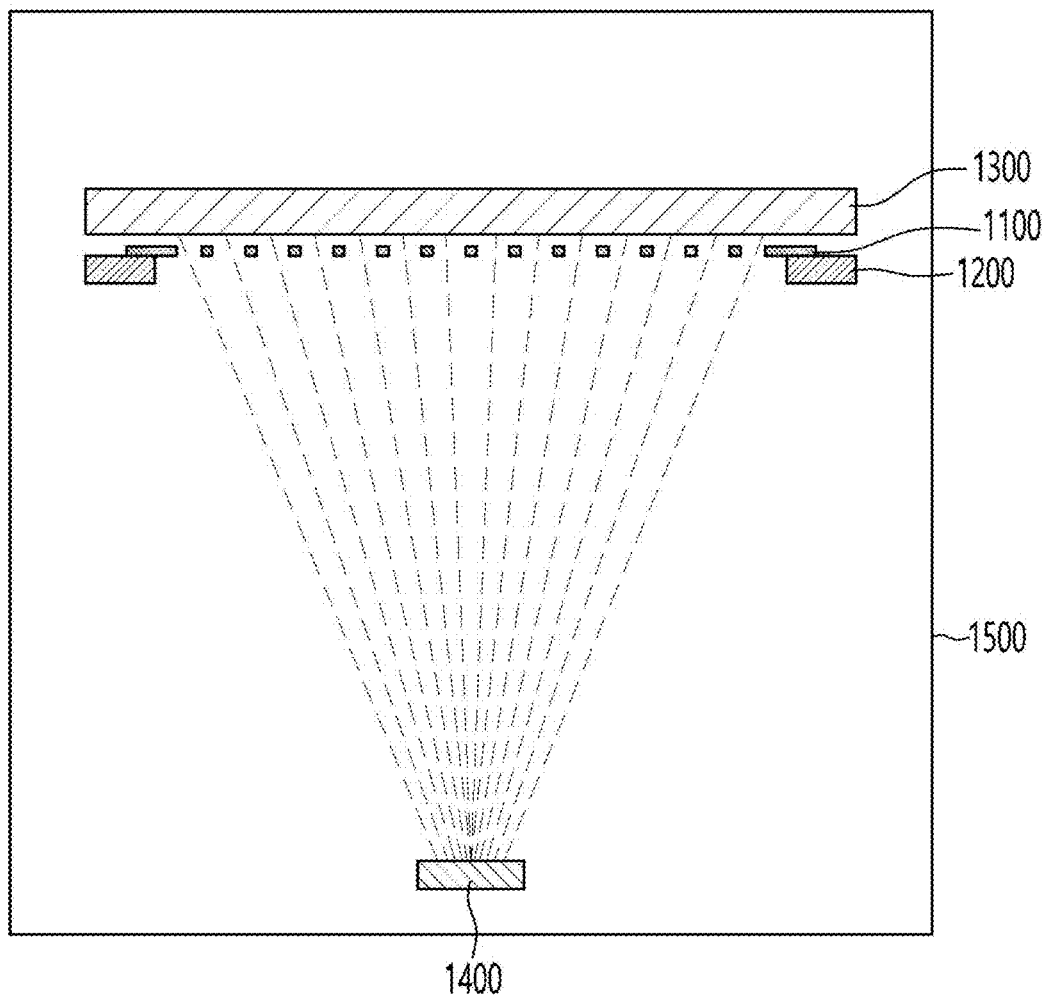

[FIG. 4]
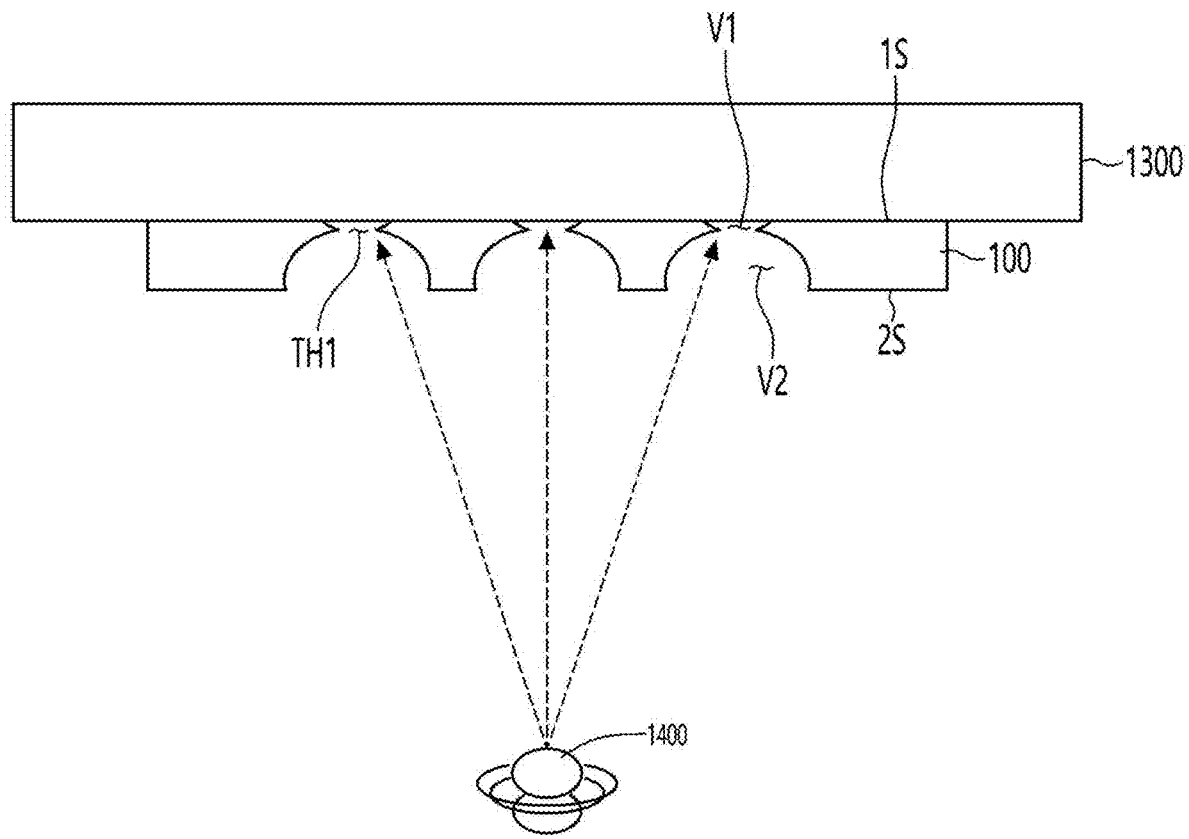
[FIG. 5]
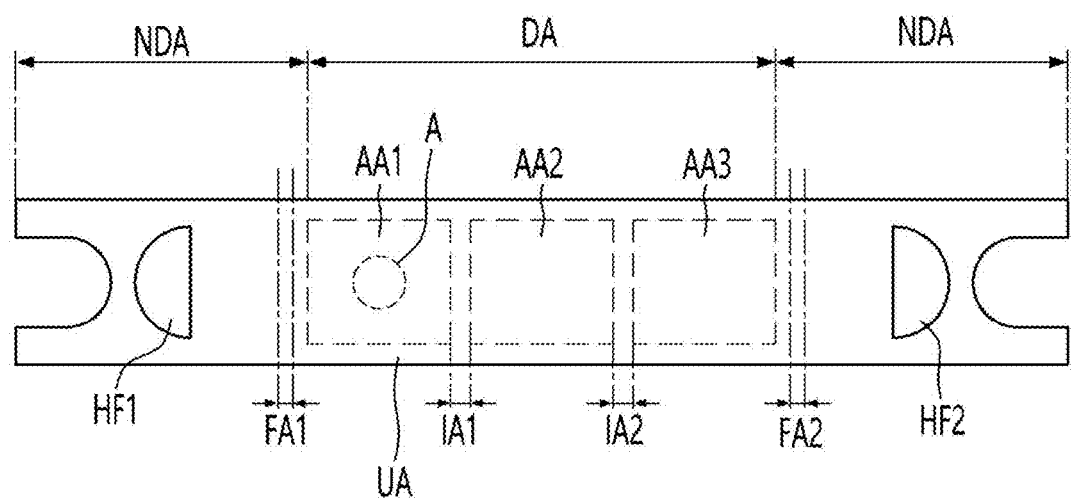

[FIG. 6]
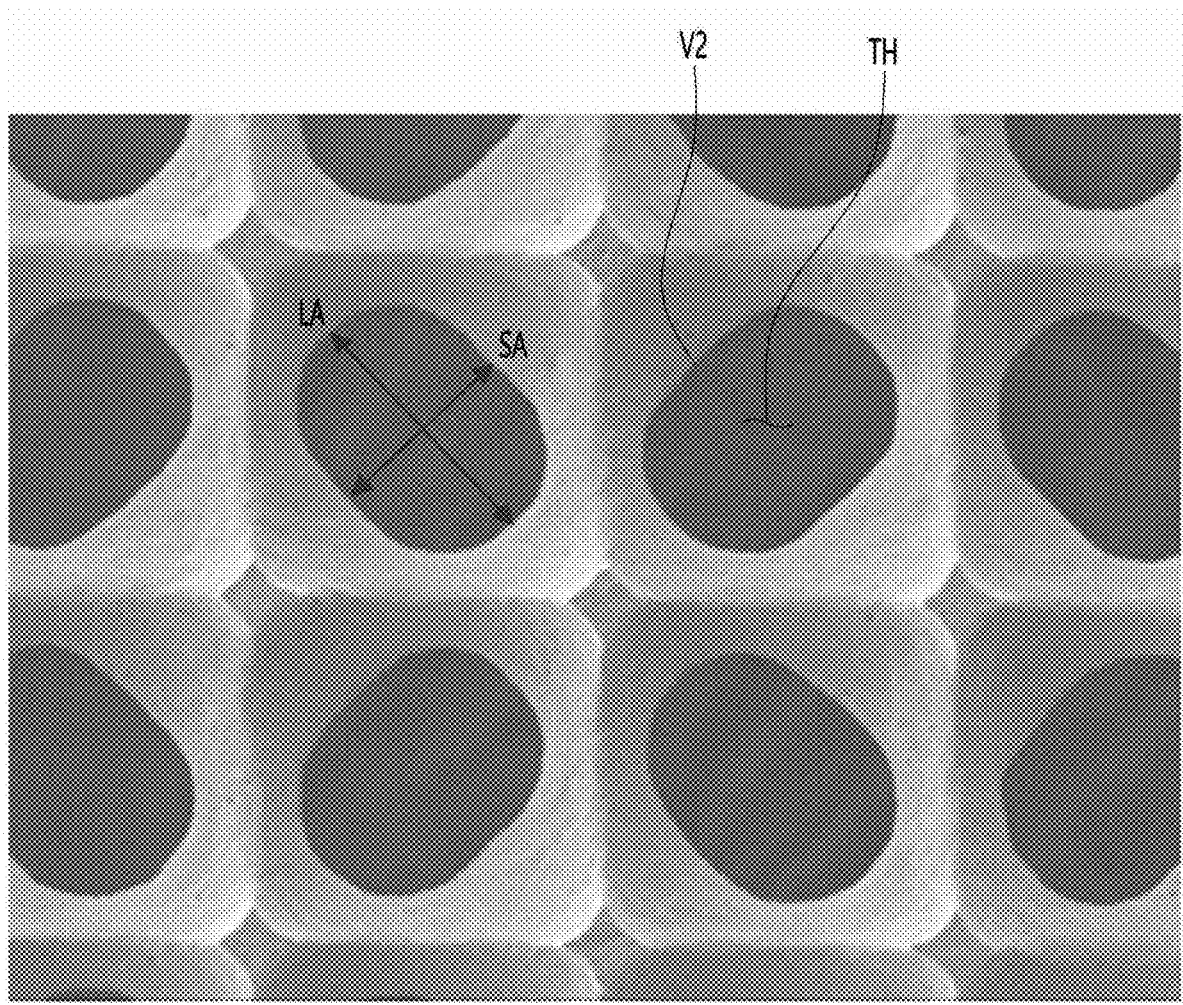

[FIG. 7]
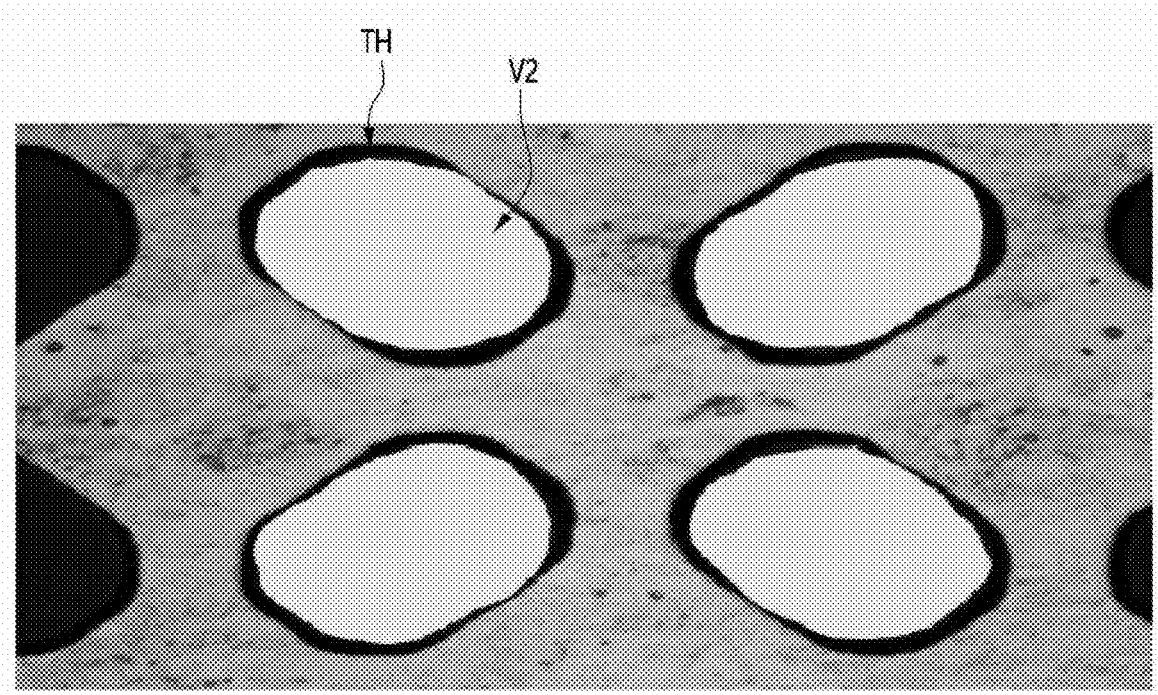
[FIG. 8]
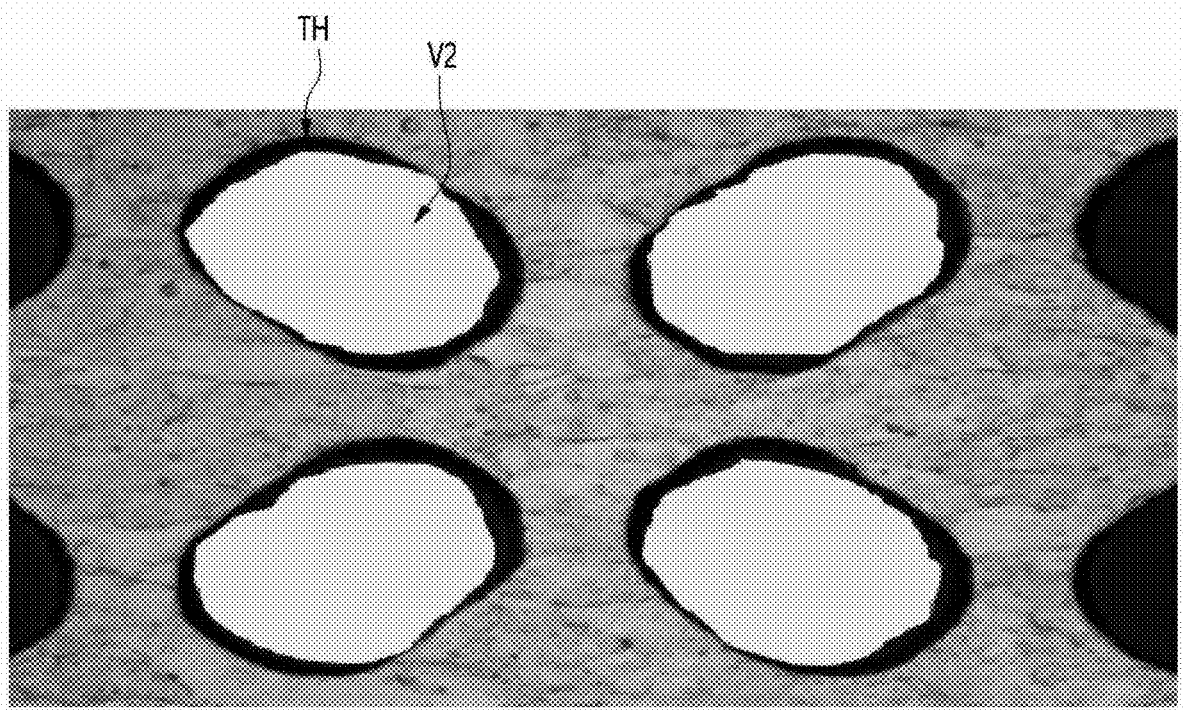

DEPOSITION MASK FOR OLED PIXEL DEPOSITION

CROSS-REFERENCE TO RELATED APPLICATIONS

This application claims priority under 35 U.S.C. 119 and 35 U.S.C. 365 to Korean Patent Application No. 10-2020-0180951 (filed on 22 Dec. 2020), which is hereby incorporated by reference in its entirety.

TECHNICAL FIELD

An embodiment relates to a deposition mask for an organic light emitting diode (OLED) pixel deposition.

BACKGROUND ART

As a display device having high resolution and low power consumption is required, various display devices such as a liquid crystal display device and an electroluminescent display device have been developed.

The electroluminescent display device has been spotlighted as a next generation display device due to excellent characteristics such as low light emission, low power consumption, and high resolution, and the like, as compared with the liquid crystal display device.

There are an organic light emitting display device and an inorganic light emitting display device in the electroluminescent display device. That is, the electroluminescent display device may be classified into the organic light emitting display device and the inorganic light emitting display device according to a material of a light emitting layer.

Of these, the organic light emitting display device has received attention because the organic light emitting display device has a wide viewing angle, has a fast response speed, and is required to have low power consumption.

An organic material constituting such a light emitting layer may be formed to have a pattern for forming a pixel on a substrate by a fine metal mask method.

Such a fine metal mask, that is, a deposition mask may have a plurality of through-holes corresponding to the pattern to be formed on the substrate, and pixel patterns of red (R), green (G), and blue (B) may be formed by depositing the organic material after aligning and depositing the deposition mask on a target substrate to be deposited.

Meanwhile, when a size of the through-hole of the deposition mask forming the pixel pattern is not uniform, the uniformity of the organic material formed on the target substrate to be deposited may be reduced together, and accordingly, the pixel pattern of the target substrate to be deposited may also be formed non-uniformly.

Therefore, a deposition mask capable of solving the above problems is required.

SUMMARY

Technical Problem

An embodiment is directed to providing a deposition mask for OLED pixel deposition having improved through-hole uniformity and deposition efficiency.

Technical Solution

A deposition mask according to an embodiment includes a metal plate including a first surface and a second surface opposite to the first surface wherein the metal plate includes iron (Fe) and nickel (Ni), a thickness of the metal plate is 15 μm to 30 μm, and the metal plate includes a first surface layer having a depth of 20% or less of the thickness of the metal plate from the first surface and a second surface layer having a depth of 20% or less of the thickness of the metal plate from the second surface, wherein when diffraction intensity with respect to a (111) crystal plane of the first surface layer is defined as I (111), diffraction intensity with respect to a (200) crystal plane is defined as I (200), and diffraction intensity with respect to a (220) crystal plane is defined as I (220), a ratio of diffraction intensity of I (220) is defined by Equation 1 below, $$A=I(220)/(I(200)+I(220)+I(111))  \quad \text{[Equation 1]}$$

a ratio of diffraction intensity of I (200) is defined by Equation 2 below, $$B=I(200)/(I(200)+I(220)+I(111))  \quad \text{[Equation 2]}$$

a ratio of diffraction intensity of I (111) is defined by Equation 3 below, $$C=I(111)/(I(200)+I(220)+I(111))  \quad \text{[Equation 3]}$$

a value of the A is greater than a value of the B and a value of the C, the value of the B is greater than the value of the C, and when a ratio of the B to the A (B/A) is defined as D, a value of the D is 0.5 to less than 1.

Advantageous Effects

A deposition mask according to an embodiment previously controls a ratio of crystal planes on first and second surfaces of a metal plate, so that it is possible to reduce a deviation of hole diameters of small surface holes formed on the first surface and large surface holes formed on the second surface.

That is, the deposition mask according to the embodiment may control a ratio of a crystal plane of a first surface layer of the first surface of the metal plate to improve the uniformity of the hole diameters of the small surface holes, and may control a ratio of a crystal plane of a second surface layer S2 of the second surface of the metal plate to improve the uniformity of the hole diameters of the large surface holes, so that it is possible to improve thickness uniformity of an organic material deposited on the deposition substrate through the deposition mask.

Accordingly, the thickness uniformity of the organic material deposited on the deposition substrate can be improved by making a deposition rate of the organic material deposited on the deposition substrate through the small surface hole uniform, and the thickness uniformity of the organic material deposited on the deposition substrate can be improved by making an amount of the organic material introduced through the large surface holes uniform for each of a plurality of through-holes.

Therefore, the deposition mask according to the embodiment may have improved deposition efficiency.

BRIEF DESCRIPTION OF THE DRAWINGS

FIG. 1 is a view illustrating a cross-sectional view of a metal plate of a deposition mask according to an embodiment.

FIG. 2 is a view for describing X-ray diffraction intensity of the metal plate according to the embodiment.

FIGS. 3 and 4 are views for describing a deposition process using the deposition mask according to the embodiment.

FIG. 5 is a view illustrating a plan view of the deposition mask according to the embodiment.

FIG. 6 is a view illustrating an enlarged view of region A in FIG. 5.

FIGS. 7 and 8 are views for comparing uniformity of surface holes of a deposition mask according to Example (FIG. 7) and Comparative Example (FIG. 8).

DETAILED DESCRIPTION OF THE EMBODIMENTS

Hereinafter, embodiments of the present disclosure will be described in detail with reference to the accompanying drawings. However, the spirit and scope of the present disclosure is not limited to a part of the embodiments described, and may be implemented in various other forms, and within the spirit and scope of the present disclosure, one or more of the elements of the embodiments may be selectively combined and replaced. In addition, unless expressly otherwise defined and described, the terms used in the embodiments of the present disclosure (including technical and scientific terms) may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present disclosure are for describing the embodiments and are not intended to limit the present disclosure. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present disclosure, the terms such as first, second, A, B, (a), and (b) may be used. These terms are only used to distinguish the elements from other elements, and the terms are not limited to the essence, order, or order of the elements.

In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, a deposition mask according to an embodiment will be described with reference to drawings.

FIG. 1 is a view illustrating a cross-sectional view of a metal plate 100 for forming the deposition mask according to the embodiment. The deposition mask according to the embodiment may be manufactured by forming a plurality of through-holes passing through a first surface 1S and a second surface 2S of the metal plate 100 in the metal plate 100.

The metal plate 100 may include a metal material. In detail, the metal plate 100 may include an alloy material including iron (Fe) and nickel (Ni).

The metal plate 100 may be formed in a thickness T of 15 μm to 30 μm. In detail, the metal plate 100 may be formed in the thickness of 15 μm to 30 μm by dissolution, forging, hot rolling, normalizing, primary cold rolling, primary annealing, secondary cold rolling, and secondary annealing processes. The thickness of the metal plate may be reduced according to the use of the deposition mask while changing a surface roughness of the metal plate 100 through the rolling and the heat treatment process.

The metal plate 100 may include the first surface 1S and the second surface 2S opposite to the first surface 1S. In addition, the metal plate 100 may include a first surface layer S1 defined on the first surface 1S and a second surface layer S2 defined on the second surface 2S. In addition, the metal plate 100 may include an inner layer I disposed between the first surface layer S1 and the second surface layer S2.

The first surface layer S1 may have a thickness of 20% or less with respect to a thickness of the metal plate 100.

In addition, the second surface layer S2 may have a thickness of 20% or less with respect to the thickness of the metal plate 100.

In addition, the inner layer I between the first surface layer S1 and the second surface layer S2 may have a thickness of 50% to 60% of the thickness of the metal plate 100. For example, the inner layer I may have a thickness greater than the thickness of the first surface layer S1 and the second surface layer S2.

As described above, the metal plate 100 includes iron and nickel. Accordingly, the metal plate 100 may be formed in a crystal structure of a face centered cubic (FCC) as a whole by forming an alloy of the iron and nickel.

In addition, the metal plate 100 may be controlled in a thickness of 15 μm to 30 μm through dissolution, forging, hot rolling, normalizing, primary cold rolling, primary annealing, secondary cold rolling and secondary annealing processes for manufacturing the deposition mask, and the FCC of the metal plate may be recrystallized by such a heat treatment and rolling process.

Accordingly, the FCC of the metal plate 100 may be recrystallized by the heat treatment and rolling process, and when a longitudinal direction of the metal plate 100 is defined as a (100) crystal plane, the metal plate 100 may include two or more crystal planes having different orientations from each other. For example, a rolled surface of the metal plate 100 may include (111), (200), and (220) crystal planes. That is, the first surface 1S and the second surface 2S of the metal plate 100 may include (111), (200), and (220) crystal planes. That is, the first surface layer S1 and the second surface layer S2 of the metal plate 100 may include (111), (200) and (220) crystal planes.

The deposition mask according to the embodiment may control a ratio of the crystal plane of the FCC that determines etching characteristics of the metal plate 100 before forming the through-hole in the metal plate. Accordingly, the deposition mask according to the embodiment may improve size uniformity of a small surface hole and a large surface hole of the deposition mask.

FIG. 2 is a view illustrating X-ray diffraction intensity of the first surface layer S1 of the metal plate 100. In detail, FIG. 2 is a graph measuring diffraction intensities of the (111) crystal plane, the (200) crystal plane, and the (220) crystal plane of the first surface layer S1 of the metal plate by X-ray diffraction analysis using CuK α X-ray.

Referring to FIG. 2, it can be seen that the X-ray diffraction intensities of the (111) crystal plane, the (200) crystal plane, and the (220) crystal plane in the first surface layer S1 are all different. In detail, it can be seen that the X-ray diffraction intensity of the (220) crystal plane in the first surface layer S1 is greater than the X-ray diffraction intensities of the (200) crystal plane and the (111) crystal plane and the X-ray diffraction intensity of the (200) crystal plane is greater than the X-ray diffraction intensity of the (111) crystal plane.

In detail, when diffraction intensity with respect to a (111) crystal plane of the first surface layer is defined as I (111), diffraction intensity with respect to a (200) crystal plane is defined as I (200), and diffraction intensity with respect to a (220) crystal plane is defined as I (220), a ratio of diffraction intensity of I (220) may be defined by Equation 1 below, a ratio of diffraction intensity of I (200) may be defined by Equation 2 below, and a ratio of diffraction intensity of I (111) may be defined by Equation 3 below.

$$A = I(220)/(I(200)+I(220)+I(111)) \quad \text{[Equation 1]}$$

$$B = I(200)/(I(200)+I(220)+I(111)) \quad \text{[Equation 2]}$$

$$C = I(111)/(I(200)+I(220)+I(111)) \quad \text{[Equation 3]}$$

In this case, a value of the A may be greater than a value of the B and a value of the C. In detail, the value of the A may be greater than 0.5. In more detail, the value of the A may be greater than 0.5 to less than 0.7. That is, the X-ray diffraction intensity of the (220) crystal plane may be greater than 50% to less than 70% with respect to the entire crystal plane.

When the value of the A is 0.5 or less or greater than 0.7, a ratio of crystal planes other than the (220) crystal plane may be changed by a change of the value of the B and the value of the C. Accordingly, when the small surface holes and the large surface holes are respectively formed on the first surface and the second surface of the metal plate, size uniformity of a hole diameter is reduced due to a difference in the ratio of the crystal planes, thereby deteriorating deposition efficiency.

In addition, the value of the B may be greater than the value of the C. In detail, the value of the B may be less than 0.4. In more detail, the value of the B may be greater than 0.25 to less than 0.4. That is, the X-ray diffraction intensity of the (200) crystal plane may be greater than 25% to less than 40% with respect to the entire crystal plane.

When the value of the B is 0.25 or less or greater than 0.4, a ratio of crystal planes other than the (200) crystal plane may be changed by the change of the value of the B and the value of the C. Accordingly, when small surface holes and the large surface holes are respectively formed on the first surface and the second surface of the metal plate, the size uniformity of the hole diameter is reduced due to the difference in the ratio of the crystal planes, thereby deteriorating deposition efficiency.

In addition, the value of the C may be smaller than the values of the A and the B. In detail, the value of the C may be less than 0.01. In more detail, the value of the C may be greater than 0.005 to less than 0.01. That is, the X-ray diffraction intensity of the (110) crystal plane may be greater than 0.5% to less than 1% with respect to the entire crystal plane.

When the value of the C is 0.005 or less or greater than 0.01, a ratio of crystal planes other than the (110) crystal plane may be changed by the change of the value of the B and the value of the C. Accordingly, when the small surface holes and the large surface holes are respectively formed on the first surface and the second surface of the metal plate, the size uniformity of the hole diameter is reduced due to the difference in the ratio of the crystal planes, thereby deteriorating deposition efficiency.

The metal plate 100 may have different etching characteristics in the first surface layer S1 and the second surface layer S2 according to the ratio of the crystal planes. In detail, the etching characteristics of the first surface layer S1 and the second surface layer S2 may vary depending on the ratio of the (111) crystal plane, the (200) crystal plane, and the (220) crystal plane of the first surface layer S1 and the second surface layer S2.

In the deposition mask according to the embodiment, it is possible to improve the etching characteristics of the first surface layer S1 and the second surface layer S2 by forming the ratio of the (220) crystal plane among the plurality of crystal planes included in the first surface layer S and the second surface layer S2 of the metal plate higher than that of the other crystal planes.

That is, the etch rate in the surface layer may be reduced by controlling the ratio of the crystal plane of the surface layer portion forming the hole diameter of the through-hole in the metal plate, so that it is possible to make uniform the hole diameter size on the first and second surfaces of the through-hole formed in the metal plate.

In detail, when the ratio of the B to the A (B/A) is defined as D, a value of the D may satisfy 0.5 to less than 1. When the value of the D is greater than 1, the hole diameter size of the through-hole formed on the first surface 1S of the metal plate 100 may become non-uniform, so that deposition characteristics of the deposition mask may be deteriorated.

In addition, when the value of the D is less than 0.5, it is difficult to implement by the heat treatment and rolling process of the metal plate, and thus process efficiency may be deteriorated.

Meanwhile, the ratio of the crystal plane of the second surface layer S2 may be similar to that of the first surface layer S1.

In detail, when diffraction intensity with respect to a (111) crystal plane of the second surface layer is defined as I'(111), diffraction intensity with respect to a (200) crystal plane is defined as I'(200), and diffraction intensity with respect to a (220) crystal plane is defined as I'(220), a ratio of diffraction intensity of I' (220) may be defined by Equation 4 below, a ratio of diffraction intensity of I' (200) may be defined by Equation 5 below, and a ratio of diffraction intensity of I'(111) may be defined by Equation 6 below.

$$A' = I'(220)/(I'(200)+I'(220)+I'(111)) \quad \text{[Equation 4]}$$

$$B' = I'(200)/(I'(200)+I'(220)+I'(111)) \quad \text{[Equation 5]}$$

$$C' = I'(111)/(I'(200)+I'(220)+I'(111)) \quad \text{[Equation 6]}$$

In this case, a value of the A' may be greater than a value of the B' and a value of the C'. In detail, the value of the A' may be greater than 0.5. In more detail, the value of the A' may be greater than 0.5 to less than 0.7. That is, the X-ray diffraction intensity of the (220) crystal plane may be greater than 50% to less than 70% with respect to the entire crystal plane.

In addition, the value of the B' may be greater than the value of the C'. In detail, the value of the B' may be less than 0.4. In more detail, the value of the B' may be greater than 0.25 to less than 0.4. That is, the X-ray diffraction intensity of the (200) crystal plane may be greater than 25% to less than 40% with respect to the entire crystal plane.

In addition, the value of the C' may be smaller than the value of the A' and the value of the B'. In detail, the value of the C' may be less than 0.01. In more detail, the value of the C' may be greater than 0.005 to less than 0.01. That is, the X-ray diffraction intensity of the (110) crystal plane may be greater than 0.5% to less than 1% with respect to the entire crystal plane.

In addition, when a ratio of the B' to the A' (B'/A') is defined as D', a value of the D' may satisfy 0.5 to less than 1. When the value of the D' is greater than 1, the hole diameter size of the through-hole formed on the second surface 2S of the metal plate 100 may become non-uniform, so that the deposition characteristics of the deposition mask may be deteriorated.

In addition, when the value of the D' is less than 0.5, it is difficult to implement by the heat treatment and rolling process of the metal plate, and thus the process efficiency may be deteriorated.

In addition, the values of the D and the D' may be similar. In detail, although rolling and heat treatment on the first surface 1S and the second surface 2S, which are rolled surfaces of the metal plate, are proceed simultaneously, the ratio of the crystal plane in the first surface layer S1 and the second surface layer S2 may have a difference depending on a process error.

In detail, the value of the D' may be 95% to 105% of the value of the D. That is, the value of the D' may be greater than or less than the value of the D by 5% or less.

Accordingly, when the surface holes are formed on each of the first surface 1S and the second surface 2S of the metal plate, the uniformity of the surface holes formed on both surfaces of the metal plate may be secured. That is, it is possible to reduce the non-uniformity in size of the surface holes formed on both surfaces of the metal plate by reducing the etching rate of the surface layer.

For example, when a small surface hole is formed on the first surface 1S and a large surface hole is formed on the second surface 2S, the small surface hole and the large surface hole communicate with each other, so that a through-hole may be formed in the metal plate.

In this case, it is possible to improve the uniformity of each organic material passing through a plurality of through-holes including the small surface hole and the large surface hole by controlling the difference between the size uniformity of the small surface holes formed on the first surface 1S and the second surface 2S and the size uniformity of the large surface holes within 5%.

Accordingly, the deposition mask according to the embodiment may improve the deposition efficiency by improving the thickness uniformity of the organic material passing through the through-holes.

FIGS. 3 and 4 are views for describing a deposition process through the deposition mask according to the embodiment.

FIG. 3 is a view illustrating an organic material deposition apparatus to which the deposition mask according to the embodiment is applied.

Referring to FIG. 3, an organic material deposition apparatus 1000 may include a deposition mask 1100, a mask frame 1200, a deposition substrate 1300, an organic material deposition container 1400, and a vacuum chamber 1500.

The deposition mask 1100, the mask frame 1200, the deposition substrate 1300, and the organic material deposition container 1400 may be accommodated in the vacuum chamber 1500. Accordingly, the deposition process through the deposition mask 1100 may be performed in a vacuum atmosphere.

The deposition substrate 1300 may be a substrate used for manufacturing a display device. For example, the deposition substrate 1300 may be a substrate for depositing an organic material for an OLED pixel pattern. Patterns of red (R), green (G), and blue (B) may be formed on the deposition substrate 1300 to form a pixel that is three primary colors of light. That is, an RGB pattern may be formed on the deposition substrate 1300.

The deposition mask 1100 may be disposed on one surface of the deposition substrate 1300. In detail, the deposition mask 1100 may be disposed on a deposition surface on which an organic material is deposited among both surfaces of the deposition substrate 1300, and may be fixed by the mask frame 1200.

Accordingly, the organic material may pass through a through-hole TH formed in the deposition mask 1100 to deposit the organic material forming the RGB pattern on a deposition surface of the deposition substrate 1300.

The organic material deposition container 1400 may be a crucible. An organic material may be disposed inside the crucible. As a heat source and/or current are supplied to the crucible that is the organic material deposition container 1400 in the vacuum chamber 1500, the organic material may pass through the deposition mask 1100 to deposit on the deposition surface the deposition substrate 1300.

FIG. 4 is a view for describing an arrangement relationship between the deposition mask 1100 and the deposition substrate 1300.

Referring to FIG. 4, the deposition mask 1100 may be disposed on the deposition surface of the deposition substrate 1300, and the deposition mask 1100 may be disposed in contact with the deposition surface of the deposition substrate 1300.

The deposition mask 1100 may be formed by forming a plurality of through-holes TH in the metal plate 100 described above.

In detail, a small surface hole V1 may be formed on the first surface 1S of the metal plate 100, and a large surface hole V2 may be formed on the second surface 2S of the metal plate 100.

The large surface hole V2 may be disposed to face the organic material deposition container 1400, whereby the large surface hole V2 may be a region into which a deposition material of the organic material deposition container 1400 is introduced, and the small surface hole V1 may be a region through which the deposition material introduced from the large surface hole V2 passes.

The small surface hole V1 and the large surface hole V2 may be formed to partially penetrate the metal plate 100. For example, a depth of the small surface hole V1 may be smaller than a depth of the large surface hole V2. In addition, the small surface hole V1 and the large surface hole V2 may be disposed at a position overlapping each other in a thickness direction of the metal plate 100 and may be formed to communicate with each other.

Accordingly, the plurality of through-holes TH formed by communicating with the small surface hole V1 and the large surface hole V2 may be formed in the metal plate 100.

The deposition mask 1100 may be disposed such that the small surface hole V1 of the deposition mask 1100 is in contact with the deposition surface of the deposition substrate 1300.

In this case, when the plurality of small surface holes V1 have different hole diameter sizes or the plurality of large surface holes V2 have different hole diameter sizes, the uniformity of the organic material deposited on the deposition substrate 1300 through the through-hole TH may be deteriorated.

When a hole diameter size of the small surface hole V1 is non-uniform, a deposition rate of the organic material introduced to the deposition substrate 1300 through the small surface hole V1 is different, so that the thickness uniformity of the organic material deposited on the deposition substrate 1300 may be deteriorated.

In addition, when a hole diameter size of the large surface hole V2 is non-uniform, an amount of the organic material introduced through the large surface hole V2 is different for each of the plurality of through-holes, so that the thickness uniformity of the organic material deposited on the deposition substrate 1300 may be deteriorated.

Accordingly, the deposition mask according to the embodiment previously controls the ratio of the crystal planes on the first surface 1S and the second surface 2S of the metal plate to reduce a deviation of hole diameters of the small surface holes V1 and the large surface holes V2, so that it is possible to solve the above problems.

That is, the deposition mask according to the embodiment may control the ratio of the crystal plane of the first surface layer S1 of the first surface 1S of the metal plate to improve the uniformity of the hole diameters of the small surface holes V1, and may control the ratio of the crystal plane of the second surface layer S2 of the second surface 2S of the metal plate to improve the uniformity of the hole diameters of the large surface holes, so that that it is possible to improve the thickness uniformity of the organic material deposited on the deposition substrate 1300 through the deposition mask.

Accordingly, the deposition mask according to the embodiment may have improved deposition efficiency.

Hereinafter, a deposition mask to which the metal plate described above is applied will be described with reference to FIGS. 5 and 6.

FIG. 5 is a view illustrating a plan view of the deposition mask according to the embodiment, and FIG. 6 is a view illustrating an enlarged view of an effective region of FIG. 5.

Referring to FIG. 5, the deposition mask 1100 according to the embodiment may include a deposition region DA and a non-deposition region NDA.

The deposition region DA may be a region for forming a deposition pattern. That is, a deposition material may be deposited to a deposition substrate through the deposition mask through the deposition region DA.

The deposition mask 1100 may include a plurality of deposition regions DA. For example, the deposition region DA may include an effective portion and an ineffective portion. In detail, the deposition region DA may include a plurality of effective portions in which a plurality of through-holes may be formed to form a deposition pattern and an ineffective portion UA in which the through-holes are not formed. The plurality of through-holes TH described above may be formed in the effective portions.

The plurality of effective portions may include a first effective portion AA1, a second effective portion AA2, and a third effective portion AA3, and may be spaced apart from each other by the separation regions IA1 and IA2.

In the case of a small-sized display device such as a smartphone, an effective portion of any one of a plurality of deposition regions included in the deposition mask 1100 may be one for forming one display device.

The non-deposition region NDA may be disposed on both sides of the deposition region DA in the longitudinal direction. That is, the non-deposition region NDA may be disposed outside the deposition region DA in the longitudinal direction.

The non-deposition region NDA may be a region not involved in deposition. The non-deposition region NDA may include frame fixing regions FA1 and FA2 for fixing the deposition mask 1100 to the mask frame 1200. In addition, the non-deposition region NDA may include half-etching portions HF1 and HF2, open portions OA1 and OA2, and protrusions PA1 and PA2.

FIG. 6 is a photograph illustrating an enlarged view of region A of the first effective portion AA1. In detail, FIG. 6 is a view showing a photograph of the large surface hole V2 of the deposition mask. Hereinafter, the large surface hole will be mainly described, but the following description may be similarly applied to the small surface hole.

Referring to FIG. 6, the plurality of large surface holes V2 may be formed in the first effective portion. In addition, the large surface hole V2 may extend in a length in a major axis LA direction and a length in a minor axis SA direction.

That is, the large surface hole V2 may have an elliptical shape having a length in a major axis direction and a length in minor axis direction. However, the embodiment is not limited thereto, and the large surface hole may be formed in various shapes such as a circular shape, a quadrangular shape, and the like.

The deposition mask according to the embodiment may include the plurality of large surface holes V2, and a deviation in size of the plurality of large surface holes may be 7% or less. In detail, in the deposition mask, a deviation in length of the large surface holes V2 in the major axis LA direction may be 7% or less. In addition, in the deposition mask, a deviation in length of the large surface holes V2 in the minor axis SA direction may be 7% or less. That is, the deviation in size of the plurality of large surface holes may be 7% or less as a whole.

In addition, although not shown in the drawings, a deviation in size of the plurality of small surface holes may be 7% or less. In detail, in the deposition mask, a deviation in length of the small surface holes V1 in the major axis direction may be 7% or less. In addition, in the deposition mask, a deviation in length of the small surface holes V1 in the minor axis direction may be 7% or less. That is, the deviation in size of the plurality of facet holes may be 7% or less as a whole.

That is, in the deposition mask according to the embodiment, it is possible to control the etching characteristics of the first surface layer and the second surface layer by controlling the ratio of the (220) crystal plane, the (200) crystal plane, and the (110) crystal plane in the first surface layer and the second surface layer of the metal plate. That is, when etching to form small surface holes and face holes in the first surface layer and the second surface layer, respectively, the etch rate can be reduced by controlling the ratio of the crystal planes.

Accordingly, in the deposition mask according to the embodiment, it is possible to make uniform the hole diameter size of the small surface holes and the large surface holes formed in the first surface layer and the second surface layer, and accordingly, when the organic material is deposited on the deposition substrate using the deposition mask, it may be deposited with a uniform thickness, thereby improving the deposition efficiency.

Hereinafter, the present disclosure will be described in more detail through Examples and Comparative Examples. Such examples are merely presented as examples in order to describe the present disclosure in more detail. Therefore, the present disclosure is not limited to such examples.

Example

Invar raw materials including iron and nickel were prepared. Then, an invar metal plate having a thickness of 20 μm was manufactured by processing the raw material through dissolution, forging, hot rolling, normalizing, primary cold rolling, primary annealing, secondary cold rolling and secondary annealing processes.

Then, X-ray diffraction intensity of the metal plate was measured by X-ray diffraction analysis, and a ratio of crystal planes of an upper surface and a lower surface was measured.

The (220) crystal plane was the highest in the ratio of the crystal planes of the upper surface and the lower surface as shown in Table 1 below.

Then, a small surface hole was formed on the upper surface of the metal plate, and a large surface hole communicating with the small surface hole was formed on the lower surface to form a through-hole to form a deposition mask, and then the uniformity of the hole diameter of the large surface hole was observed.

Comparative Example

After manufacturing an invar metal plate having a thickness of 20 μm in the same manner as in Example, X-ray diffraction intensity of the metal plate was measured by X-ray diffraction analysis, and the ratio of the crystal planes of the upper surface and the lower surface was measured.

The (220) crystal plane was the highest in the ratio of the crystal planes of the upper surface and the lower surface as shown in Table 1 below.

Then, a small surface hole was formed on the upper surface of the metal plate, and a large surface hole communicating with the small surface hole was formed on the lower surface to form a through-hole to form a deposition mask, and then the uniformity of the hole diameter of the large surface hole was observed.

TABLE 1

|  | Example | Comparative Example |
|---|---|---|
| Ratio of (111) crystal plane (%) | 0.7 | 1.0 |
| Ratio of (200) crystal plane (%) | 37.0 | 59.2 |
| Ratio of (220) crystal plane (%) | 62.3 | 39.8 |
| (200) crystal plane/(220) crystal plane | 0.59 | 1.49 |

Referring to Table 1, it can be seen that the deposition mask according to Example has a different ratio of the crystal plane from the deposition mask according to Comparative Example.

That is, referring to Table 1, it can be seen that the deposition mask according to Example has the highest ratio of the (220) crystal plane, and the deposition mask according to Comparative Example has the highest ratio of the (200) crystal plane.

In addition, it can be seen that a value of the (200) crystal plane/(220) crystal plane of the deposition mask according to the Example is lower than 1, and a value of the (200) crystal plane/(220) crystal plane is higher than 1 in the deposition mask according to Comparative Example.

FIGS. 7 and 8 are views illustrating formation regions of the large surface holes according to Example and Comparative Example, respectively and are views in which surface holes of the large surface holes are displayed in yellow.

Referring to FIGS. 7 and 8, it can be seen that sizes of the surface holes of the large surface holes of the deposition mask according to Example have better uniformity compared to sizes of the surface holes of the deposition mask according to Comparative Example.

That is, it can be seen that the deposition mask according to Example may control the ratio of the crystal planes of the surface of the metal plate to reduce the etching rate when forming the small surface hole and the large surface hole, so that sizes of surface holes of the plurality of through-holes may be made uniform.

The characteristics, structures and effects described in the embodiments above are included in at least one embodiment but are not limited to one embodiment. Furthermore, the characteristic, structure, and effect illustrated in each embodiment may be combined or modified for other embodiments by a person skilled in the art. Therefore, it should be construed that contents related to such a combination and such a modification are included in the scope of the present disclosure.

In addition, embodiments are mostly described above, but the embodiments are merely examples and do not limit the present disclosure, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present disclosure defined in the following claims.

What is claimed is:

1. A metal plate comprising a first surface and a second surface opposite to the first surface,
wherein the metal plate includes iron (Fe) and nickel (Ni), a thickness of the metal plate is 15 μm to 30 μm, and the metal plate includes a first surface layer having a depth of 20% or less of the thickness of the metal plate from the first surface, a second surface layer having a depth of 20% or less of the thickness of the metal plate from the second surface, and an inner layer between the first surface layer and the second surface layer,
wherein the first surface layer, the second surface layer and the inner layer have the same material, and
wherein the first surface layer, the second surface layer and the inner layer have a crystal structure of a face centered cubic as a whole,
wherein when X-ray diffraction intensity with respect to a first crystal plane (111) of the first surface layer is defined as I (111), X-ray diffraction intensity with respect to a second crystal plane (200) of the first surface layer is defined as I (200), and X-ray diffraction intensity with respect to a third crystal plane (220) of the first surface layer is defined as I (220),
a ratio of diffraction intensity of I (220) is defined by Equation 1 below, $$A = I(220)/(I(200) + I(220) + I(111))$$ [Equation 1]

a ratio of diffraction intensity of I (200) is defined by Equation 2 below, $$B = I(200)/(I(200) + I(220) + I(111))$$ [Equation 2]

a ratio of diffraction intensity of I (111) is defined by Equation 3 below, $$C = I(111)/(I(200) + I(220) + I(111))$$ [Equation 3]

a value of the A is greater than a value of the B and a value of the C, the value of the B is greater than the value of the C, and when a ratio of the B to the A (B/A) is defined as D, a value of the D is 0.5 to less than 1, wherein the A is greater than 0.5 to less than 0.7, the B is greater than 0.25 to less than 0.4, and the C is greater than 0.005 to less than 0.01.

2. The metal plate of claim 1, wherein when X-ray diffraction intensity with respect to a first crystal plane (111) of the second surface layer is defined as I' (111), X-ray diffraction intensity with respect to a second crystal plane (200) of the second surface layer is defined as I' (200), and X-ray diffraction intensity with respect to a third crystal plane (220) of the second surface layer is defined as I' (220), a ratio of diffraction intensity of I' (220) is defined by Equation 4 below, $$A'=I'(220)/(I'(200)+I'(220)+I'(111))$$ [Equation 4]

a ration of diffraction intensity of I' (200) is defined by Equation 5 below, $$B'=I'(200)/(I'(200)+I'(220)+I'(111))$$ [Equation 5]

a ratio of diffraction intensity of I' (111) is defined by Equation 6 below, $$C'=I'(111)/(I'(200)+I'(220)+I'(111))$$ [Equation 6]

a value of the A' is greater than a value of the B' and a value of the C', the value of the B' is greater than the value of the C', and when a ratio of the B' to the A' (B'/A') is defined as D', a value of the D' is 0.5 to less than 1.

3. The metal plate of claim 2, wherein the A' is greater than 0.5 to less than 0.7, the B' is greater than 0.25 to less than 0.4, and the C' is greater than 0.005 to less than 0.01.

4. The metal plate of claim 2, wherein the value of the D' has a value of 95% to 105% of the value of the D.

5. A deposition mask comprising a metal plate including a first surface and a second surface opposite to the first surface, wherein the metal plate includes a plurality of smaller surface holes formed on the first surface and a plurality of larger surface holes formed on the second surface and communicating with the smaller surface holes, the metal plate includes iron (Fe) and nickel (Ni), a thickness of the metal plate is 15 μm to 30 μm, and the metal plate includes a first surface layer having a depth of 20% or less of the thickness of the metal plate from the first surface, a second surface layer having a depth of 20% or less of the thickness of the metal plate from the second surface, and an inner layer between the first surface layer and the second surface layer, wherein the first surface layer, the second surface layer and the inner layer have the same material, and wherein the first surface layer, the second surface layer and the inner layer have a crystal structure of a face centered cubic as a whole, wherein when X-ray diffraction intensity with respect to a first crystal plane (111) of the first surface layer is defined as I (111), X-ray diffraction intensity with respect to a second crystal plane (200) of the first surface layer is defined as I (200), and X-ray diffraction intensity with respect to a third crystal plane (220) of the first surface layer is defined as I (220), a ratio of diffraction intensity of I (220) is defined by Equation 1 below, $$A=I(220)/(I(200)+I(220)+I(111))$$ [Equation 1]

a ratio of diffraction intensity of I (200) is defined by Equation 2 below, $$B=I(200)/(I(200)+I(220)+I(111))$$ [Equation 2]

a ratio of diffraction intensity of I (111) is defined by Equation 3 below, $$C=I(111)/(I(200)+I(220)+I(111))$$ [Equation 3]

a value of the A is greater than a value of the B and a value of the C, the value of the B is greater than the value of the C, and when a ratio of the B to the A (B/A) is defined as D, a value of the D is 0.5 to less than 1, wherein the A is greater than 0.5 to less than 0.7, the B is greater than 0.25 to less than 0.4, and the C is greater than 0.005 to less than 0.01.

6. The deposition mask of claim 5, wherein when X-ray diffraction intensity with respect to a first crystal plane (111) of the second surface layer is defined as I' (111), X-ray diffraction intensity with respect to a second crystal plane (200) of the second surface layer is defined as I' (200), and X-ray diffraction intensity with respect to a third crystal plane (220) of the second surface layer is defined as I' (220), a ratio of diffraction intensity of I' (220) is defined by Equation 4 below, $$A'=I'(220)/(I'(200)+I'(220)+I'(111))$$ [Equation 4]

a ration of diffraction intensity of I' (200) is defined by Equation 5 below, $$B'=I'(200)/(I'(200)+I'(220)+I'(111))$$ [Equation 5]

a ratio of diffraction intensity of I' (111) is defined by Equation 6 below, $$C'=I'(111)/(I'(200)+I'(220)+I'(111))$$ [Equation 6]

a value of the A' is greater than a value of the B' and a value of the C', the value of the B' is greater than the value of the C', and when a ratio of the B' to the A' (B'/A') is defined as D', a value of the D' is 0.5 to less than 1.

7. The deposition mask of claim 6, wherein the A' is greater than 0.5 to less than 0.7, the B' is greater than 0.25 to less than 0.4, and the C' is greater than 0.005 to less than 0.01.

8. The deposition mask of claim 6, wherein the value of the D' has a value of 95% to 105% of the value of the D.

9. The deposition mask of claim 5, wherein a deviation in size of the plurality of smaller surface holes is 7% or less, and a deviation in size of the plurality of larger surface holes is 7% or less.

\* \* \* \* \*